(12) United States Patent
Romanov et al.

(10) Patent No.: US 10,361,638 B2
(45) Date of Patent: Jul. 23, 2019

(54) APPARATUS FOR GENERATING HIGH PULSE VOLTAGE

(71) Applicant: Closed-up Joint-Stock Company DRIVE, Novosibirsk (RU)

(72) Inventors: Yuriy I. Romanov, Novosibirsk (RU); Stanislav V. Maletskiy, Novosibirsk (RU)

(73) Assignee: Drive CJSC, Novosibirsk (RU)

( * ) Notice: Subject to any disclaimer, the term of this patent is extended or adjusted under 35 U.S.C. 154(b) by 0 days.

(21) Appl. No.: 16/092,517

(22) PCT Filed: May 4, 2016

(86) PCT No.: PCT/RU2016/000272
§ 371 (c)(1),
(2) Date: Oct. 10, 2018

(87) PCT Pub. No.: WO2017/192059
PCT Pub. Date: Nov. 9, 2017

(65) Prior Publication Data
US 2019/0165690 A1 May 30, 2019

(51) Int. Cl.
H02M 3/335 (2006.01)
H02M 7/217 (2006.01)
H02M 1/44 (2007.01)

(52) U.S. Cl.
CPC ....... H02M 7/217 (2013.01); H02M 3/33523 (2013.01); H02M 1/44 (2013.01)

(58) Field of Classification Search
CPC .......... H02M 1/44; H02M 7/217; H02M 7/48; H02M 7/527; H02M 7/537; H02M 1/08; H02M 2001/342; H02M 2001/0006

USPC ........... 363/21.04, 21.1, 21.11, 21.12, 21.18
See application file for complete search history.

(56) References Cited

U.S. PATENT DOCUMENTS

| | | | | |
|---|---|---|---|---|
| 6,069,803 A * | 5/2000 | Cross | ............... | H02M 3/33569 363/21.14 |
| 6,639,811 B2 * | 10/2003 | Hosotani | ............. | H02M 3/3385 363/19 |
| 7,006,364 B2 * | 2/2006 | Jin | .......... | H02M 1/08 363/131 |
| 8,488,348 B2 * | 7/2013 | Hong | ............... | H02M 3/33569 363/21.18 |
| 2002/0067624 A1 * | 6/2002 | Nishiyama | ........ | H02M 3/33569 363/21.01 |
| 2007/0115699 A1 * | 5/2007 | Yang | ................. | H02M 3/33569 363/21.03 |
| 2009/0268489 A1 * | 10/2009 | Lin | .......... | H02M 1/34 363/50 |
| 2015/0198963 A1 * | 7/2015 | Romanov | ............. | H02M 3/156 323/312 |
| 2017/0083032 A1 * | 3/2017 | Romanov | ................ | G05F 1/56 |

* cited by examiner

Primary Examiner — Alex Torres-Rivera
(74) Attorney, Agent, or Firm — Patentagar PLLC; Alexander Rabinovich

(57) ABSTRACT

A device for generating a high pulse voltage comprises a source of high constant voltage, an inductive load, two controllable switching devices, a controllable switch, and also, connected in series, a capacitor, a diode and an additional controllable switch, and a controllable pulse duration converter for converting the duration of pulses from a control circuit. The result is a reduction in the level of interference emitted into the environment.

1 Claim, 3 Drawing Sheets

APPARATUS FOR GENERATING HIGH PULSE VOLTAGE

BACKGROUND OF THE INVENTION

1. Field of the Invention

The proposed design relates to electrical engineering and can be used for providing high voltage pulse power supply having minimally possible level of electromagnetic interference/noise radiated out to the environment.

2. Description of Related Art

Similar engineering designs have been known in the art, see e.g. D. Makashov "Technology of active damping in DC-DC converters". The known apparatus for generating high pulse voltage in an inductive load, chosen as an analog, comprises:
  a high DC voltage source;
  an inductive load (which includes a primary winding of a transformer, a secondary winding thereof being connected to a rectifier) connected by one (a first) terminal thereof to a positive terminal of the high DC voltage source;
  a low DC voltage source connected by a negative terminal thereof to a negative terminal of the high DC voltage source;
  a square pulse generator connected by a positive power input thereof and by a negative power input thereof to respective terminals of the low DC voltage source;
  a control circuit connected by a first and a second inputs thereof via a first and a second delay elements to an output of the square pulse generator;
  a diode connected by an anode thereof to the positive terminal of the low DC voltage source;
  a first capacitor connected by one (a first) plate thereof to a cathode of the diode and to a positive power input of the control circuit and connected by another (a second) plate thereof to a negative power input of the control circuit and to another terminal of the inductive load;
  a first controlled gate connected by a first (main) terminal thereof to the other (second) terminal of the inductive load, and connected by a second terminal thereof to the negative terminal of the high DC voltage source, and connected by a control input thereof to a first output of the control circuit;
  a second controlled gate connected by a control input thereof to a second output of the control circuit, and connected by a second terminal thereof to the second terminal of the inductive load;
  a second capacitor connected by one (a first) plate thereof to a first (main) terminal of the second controlled gate and connected by another (a second) plate thereof to the positive terminal of the high DC voltage source.

The features which are common for the proposed design and the above analog are:
  a high DC voltage source;
  an inductive load connected by one (a first) terminal thereof to a positive terminal of the high DC voltage source;
  a low DC voltage source connected by a negative terminal thereof to a negative terminal of the high DC voltage source;
  a first controlled gate connected by a first (main) terminal thereof to the other (second) terminal of the inductive load, and connected by a second terminal thereof to the negative terminal of the high DC voltage source;
  a control circuit connected by a first output thereof to a control input of the first controlled gate;
  a diode;
  a first capacitor connected by one (a first) plate thereof to a cathode of the diode and by another (a second) plate thereof to the other terminal of the inductive load;
  a second controlled gate connected by a second terminal thereof to the second terminal of the inductive load;
  a second capacitor connected by one (a first) plate thereof to a first (main) terminal of the second controlled gate and connected by another (a second) plate thereof to the positive terminal of the high DC voltage source.

Also known has been a design (US patent application 20110305048A1 published Dec. 15, 2011). It was chosen a closest analog, the prototype, and it comprises the following aggregation of features:
  a high DC voltage source;
  an inductive load (which includes a primary winding of a transformer, a secondary winding thereof being connected to a rectifier) connected by one (a first) terminal thereof to a positive terminal of the high DC voltage source;
  a low DC voltage source (including a third winding of the transformer, a rectifying diode, and a filtering capacitor) connected by a negative terminal thereof to a negative terminal of the high DC voltage source;
  a control circuit connected by power inputs thereof to respective terminals of the low DC voltage source;
  a first controlled gate connected by a first (main) terminal thereof to the other (second) terminal of the inductive load, and connected by a second terminal thereof to the negative terminal of the high DC voltage source, and connected by a control input thereof to a first output of the control circuit;
  a diode connected by an anode thereof to the positive terminal of the low DC voltage source;
  a controlled switch connected by a first input thereof to a cathode of the diode, and connected by a second input thereof to the second terminal of the inductive load, and connected by a control input thereof to a second output of the control circuit;
  a first capacitor connected by a first plate thereof to the first input of the controlled switch and connected by a second plate thereof to the second input of the controlled switch;
  a second controlled gate connected by a control input thereof to an output of the controlled switch and connected by a second terminal thereof to the second terminal of the inductive load; and
  a second capacitor connected by a first plate thereof to a first (main) terminal of the second controlled gate and connected by a second plate thereof to the positive terminal of the high DC voltage source.

The features common for the proposed design and the prototype are:
  the high DC voltage source;
  the inductive load made as a winding on a magnetic conductor and including a primary winding of a transformer also comprising a secondary winding connected to a rectifier, a first terminal of the inductive load being connected to a positive terminal of the high DC voltage source;
  the low DC voltage source connected by a negative terminal thereof to a negative terminal of the high DC voltage source;

the control circuit connected by power inputs thereof to respective terminals of the low DC voltage source;

the first controlled gate connected by the first (main) input thereof to the other (second) terminal of the inductive load and connected by another terminal thereof to the negative terminal of the high DC voltage source and connected by the control input thereof to the first output of the control circuit;

the diode;

the controlled switch connected by the first input thereof to the cathode of the diode, and connected by the second input thereof to the second terminal of the inductive load, and connected by the control input thereof to the second output of the control circuit;

the first capacitor connected by the first plate thereof to the first input of the controlled switch and connected by the other plate thereof to the second input of the controlled switch;

the second controlled gate connected by the control input thereof to the output of the controlled switch and connected by the second terminal thereof to the second terminal of the inductive load; and the second capacitor connected by one of the plates thereof to the first (main) terminal of the second controlled gate and connected by the other plate thereof to the positive terminal of the high DC voltage source.

The effect which is impossible to achieve in any of the above-discussed prior art designs lies in lowering the level of short-term pulse electromagnetic noise radiated by prior art apparatuses for generating high pulse voltage because of inertia of non-linear elements, first of all the diode connected to the first capacitor.

The reason for failure to achieve the above-identified effect in the prior art designs is believed to be lack of attention to the problem of reducing the level of short-term pulse electromagnetic noise radiated to the environment.

With the characteristics of the prior art designs in view, it is possible to conclude that the problem of inventing apparatuses for providing high pulse voltage in an inductive load that ensure minimally possible level of short-term pulse electromagnetic noise radiated to the environment is of current interest.

SUMMARY OF THE INVENTION

The effect mentioned above is achieved by proposing an apparatus for generating high pulse voltage, the apparatus comprising:

a high DC voltage source;

an inductive load made as a winding on a core and including, for example a primary winding of a transformer, a secondary winding thereof being connected to a rectifier;

a low DC voltage source;

a control circuit;

a first controlled gate;

a diode;

a first controlled switch;

a first capacitor;

a second controlled gate;

a second capacitor;

a second controlled switch; and a square pulse duration converter;

a first terminal of the inductive load being connected to a positive terminal of the high DC voltage source;

a negative terminal of the low DC voltage source being connected to a negative terminal of the high DC voltage source;

power inputs of the control circuit being connected to respective terminals of the low DC voltage source;

a first (main) terminal of the first controlled gate being connected to a second terminal of the inductive load, a second terminal of the first controlled gate being connected to the negative terminal of the high DC voltage source, and a control input of the first controlled gate being connected to a first output of the control circuit;

a first input of the first controlled switch being connected to a cathode of the diode, a second input of the first controllable switch being connected to the second terminal of the inductive load, a control input of the first controlled switch being connected to a second output of the control circuit;

a first plate of the first capacitor being connected to the first input of the first controlled switch, a second plate of the first capacitor being connected to the second input of the first controlled switch;

a control input of the second controlled gate being connected to an output of the first controlled switch, a second terminal of the second controlled gate being connected to the second terminal of the inductive load;

a first plate of the second capacitor being connected to the first terminal of the second controlled gate, a second plate of the second capacitor being connected to the positive terminal of the high DC voltage source;

an input of the square pulse duration converter being connected to the first output of the control circuit, an output of the square pulse duration converter being connected to a control input of the second controlled switch;

a first input of the second controlled switch being connected to the positive terminal of the low DC voltage source, a second input of the second controlled switch being connected to the negative terminal of the low DC voltage source, an output of the second controlled switch being connected to an anode of the diode.

Adding the second controlled switch and square pulse duration converter with the connections thereof secures the following: as a square pulse from the output of the control circuit is applied to the control input of the first controlled gate and at the same time, through the square pulse duration converter, to the control input of the second controlled switch (which, by action of this square pulse, connects the first input thereof to the positive terminal of the low DC voltage source), the first capacitor is charged in the following circuit: the positive terminal of the low DC voltage source—the second controlled switch—the diode—the first capacitor—the open first controlled gate—the negative terminal of the low DC voltage source. Consequently, a voltage appears at the plates of the first capacitor, close by value thereof to the output voltage of the low DC voltage source.

As this takes place, the voltage between the terminals of the inductive load (the primary winding of the transformer) becomes equal to the potential difference between the positive terminal of the high DC voltage source and the first (main) terminal of the open first controlled gate (having almost zero resistance in the open state thereof), i.e. close to the output voltage of the high DC voltage source. This reflects the beginning of generating high pulse voltage in the inductive load.

After the square pulse at the first output of the control circuit ends, the first controlled gate goes off, and the voltage at the first (main) terminal thereof increases sharply and becomes equal to the sum of the output voltage of the high DC voltage source and the voltage between the terminals of the inductive load. At this moment, the potential difference between the terminals of the inductive load changes the sign thereof, and this means the end of generating high pulse voltage in the inductive load.

In the prior art designs, at the moment of closing the first controlled gate when, thus, a high potential at the first (main) terminal of the first controlled gate is created, this potential is applied to the cathode of the diode. Due to a transit time of the diode (a non-linear element), a surge of current emerges through the non-linear element (diode) creating pulse electromagnetic noise. This takes place because pulse current flows in the following circuit: a connection point of the first (main) terminal of the first controlled gate and the second terminal of the inductive load—the first capacitor—the diode in the process of closing but not off as of yet—the positive terminal of the low DC voltage source—the negative terminal of the high DC voltage source—the positive terminal of the high DC voltage source—the inductive load.

Unlike that, in the proposed design, the duration of the pulse at the output of the square pulse duration converter is chosen in such a way that the trailing edge of this pulse go, for some time, ahead of the trailing edge of the square pulse coming to the control input of the first controlled gate. This "some" time is usually of about several hundred nanoseconds, subject to the type of the non-linear element (diode) and is believed to be sufficient enough for the transient process in the diode to end. Thus, the off-state of the diode is ensured because applied to the cathode thereof is the voltage between the plates of the earlier-charged first capacitor nearly equal to the output voltage of the low DC voltage source. So, the above-described circuit for flowing pulse current is closed in advance due to predictive connection of the second input of the second controlled switch (and, consequently, the anode of the diode) with the negative terminal of the low DC voltage source. As a result of that, by the moment of closing the first controlled gate and, accordingly, by the moment the high potential at the first (main) terminal thereof emerges applied to the cathode of the diode, the current through the diode does not flow anymore, and the above-discussed pulse electromagnetic noise (emerging in the prior art designs at the moment of closing the first controlled gate) is not generated.

This phenomenon of the occurrence of the pulse electromagnetic noise in the prior art designs is general enough since the switching time of high voltage diodes ($\tau_{diode}$) is larger, as a matter of principle, than the time of closing current power semiconductor devices. Therefore, the predictive connecting of the anode of the diode (with the aid of the added square pulse duration converter, the second controlled switch and the connections thereof) to the negative terminal of the low DC voltage source, used in the proposed design, specifically ensures adapting the diode switching time and the moment of closing the first controlled gate in such a way that the pulse electromagnetic noise, present in the prior art designs, is absent in the proposed design.

Summing up, the proposed design ensures that the level of the pulse electromagnetic noise, which it radiates out to the environment, is lowered, whereby electromagnetic compatibility of electronic units of various profiles is improved, as well as the ecological situation in human environment. It is in this way that the above-identified effect is attained.

Reviewing the prior art designs showed that none of them comprises the aggregation of features—known and new. It follows from that that the proposed design satisfies the criteria of novelty and inventive step.

BRIEF DESCRIPTION OF DRAWINGS

The proposed apparatus for generating high pulse voltage is illustrated by an ensuing description and drawings, where.

DETAILED DESCRIPTION OF THE INVENTION

Figure 1:
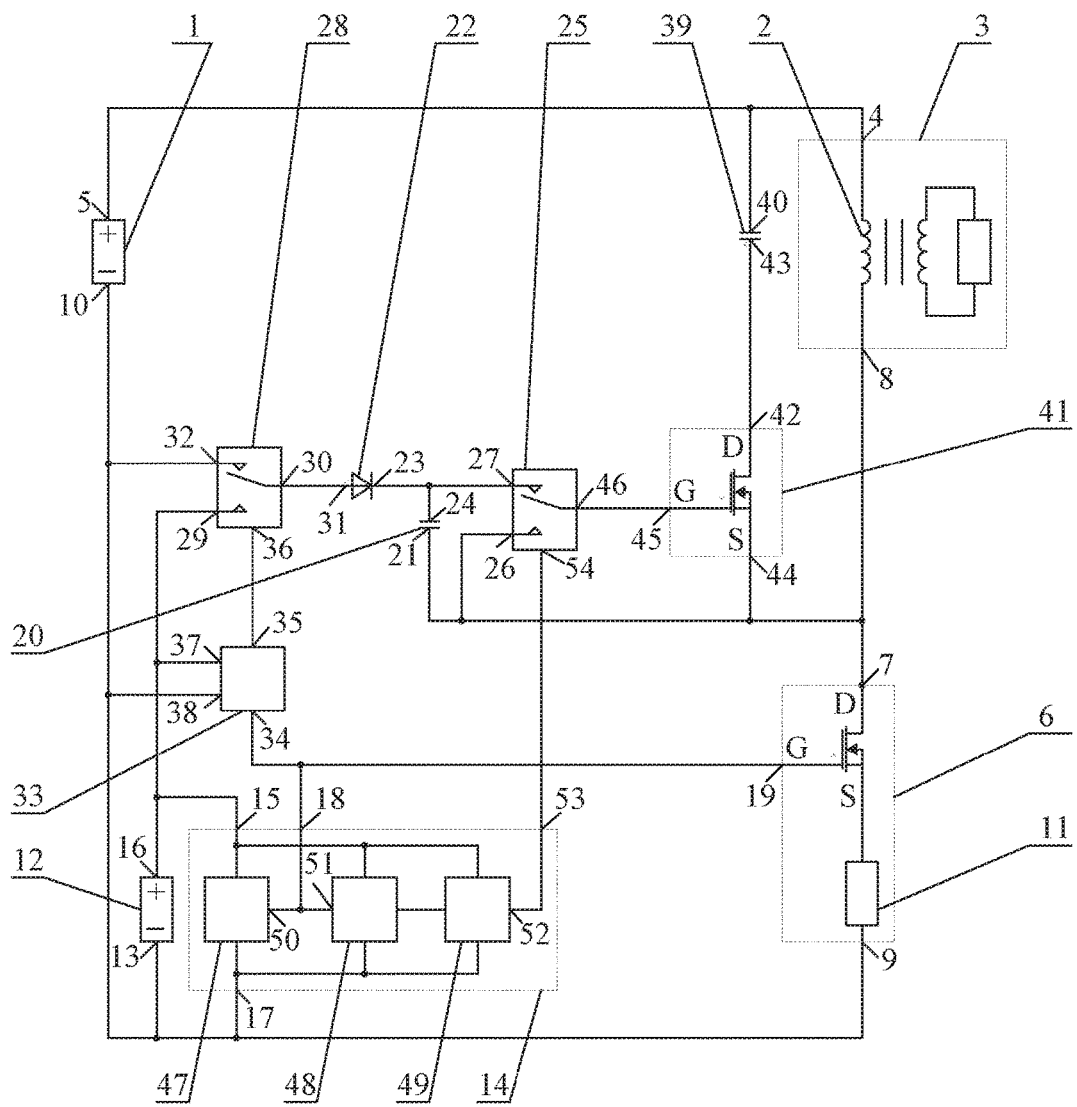
FIG. 1 is a functional scheme of an apparatus for generating high pulse voltage.

The apparatus for providing high pulse voltage comprises:
a high DC voltage source 1;
an inductive load 2 made as a winding on a magnetic conductor and including a primary winding of a transformer 3 using a ferromagnetic core and a secondary winding connected, for example, to a rectifier, the inductive load 2 being connected via one of terminals thereof (a first one), 4, to a positive terminal 5 of the high DC voltage source 1;
a first controllable gate 6 (including, for example, a MOS transistor) connected by a first terminal 7 thereof (by the drain of the MOS transistor) to another (a second) terminal 8 of the inductive load 2 and connected by a second terminal 9 thereof to a negative terminal 10 of the high DC voltage source 1 (connected between the source of the MOS transistor and a second terminal of the first controlled gate 6 can be a low-ohmic resistor 11 limiting the value of the current flowing through the source of the MOS transistor of the first controlled gate);
a low DC voltage source 12 connected by a negative terminal 13 thereof to the negative terminal 10 of the high DC voltage source 1;
a control circuit 14 connected by a positive power input 15 thereof to a respective (positive) terminal 16 of the low DC voltage source 12, connected by a negative power input 17 thereof to the respective (negative) terminal 13 of the low DC voltage source 12, and connected by a first output 18 thereof to a control input 19 of the first controlled gate 6 (to the gate of the MOS transistor);
a first capacitor 20 connected by one (first) plate 21 thereof to the second terminal 8 of the inductive load;
a diode 22 connected by a cathode 23 thereof to another (second) plate 24 of the first capacitor 20;
a first controlled switch connected by a first input 26 thereof to the first plate 21 of the first capacitor 20 and connected by a second input 27 thereof to the second plate 24 of the first capacitor 20;
a second controlled switch 28 connected by one (first) input 29 thereof to the positive terminal 16 of the low DC voltage source 12, connected by an output 30 thereof to an anode 31 of the diode 22, and connected by a second input 32 thereof to the negative terminal 13 of the low DC voltage source 12;
a first converter 33 of square pulse duration connected by an input 34 thereof to the first output 18 of the control circuit 14, connected by an output 35 thereof to a control input 36 of the second controlled switch 28, and connected by power inputs 37, 38 thereof to the respective terminals 16 and 13 of the low DC voltage source 12;
a second capacitor 39 connected by one (a first) of plates, 40, thereof to the positive terminal 5 of the high DC voltage source 1;

a second controlled gate 41 (including, for example, a MOS transistor) connected by a first (main) terminal 42 thereof (the drain of the MOS transistor) to another (second) plate 43 of the second capacitor 39, connected by a second terminal 44 thereof (the source of the MOS transistor) to the second terminal 8 of the inductive load 2, and connected by a control input 45 thereof to an output 46 of the first controlled switch 25;

the control circuit 14 comprising, for example, connected in series a generator 47 of square pulses, an element 48 of delay of square pulses, and a second converter 49 of square pulse duration, an output 50 of the generator 47 of square pulses connected to an input 51 of the delay element 48 being the first output 18 of the control circuit 14, and an output 52 of the second converter 40 of square pulse duration being a second output 53 of the control circuit 14 connected to a control input 54 of the first controlled switch 25.

Figures 1, 2:
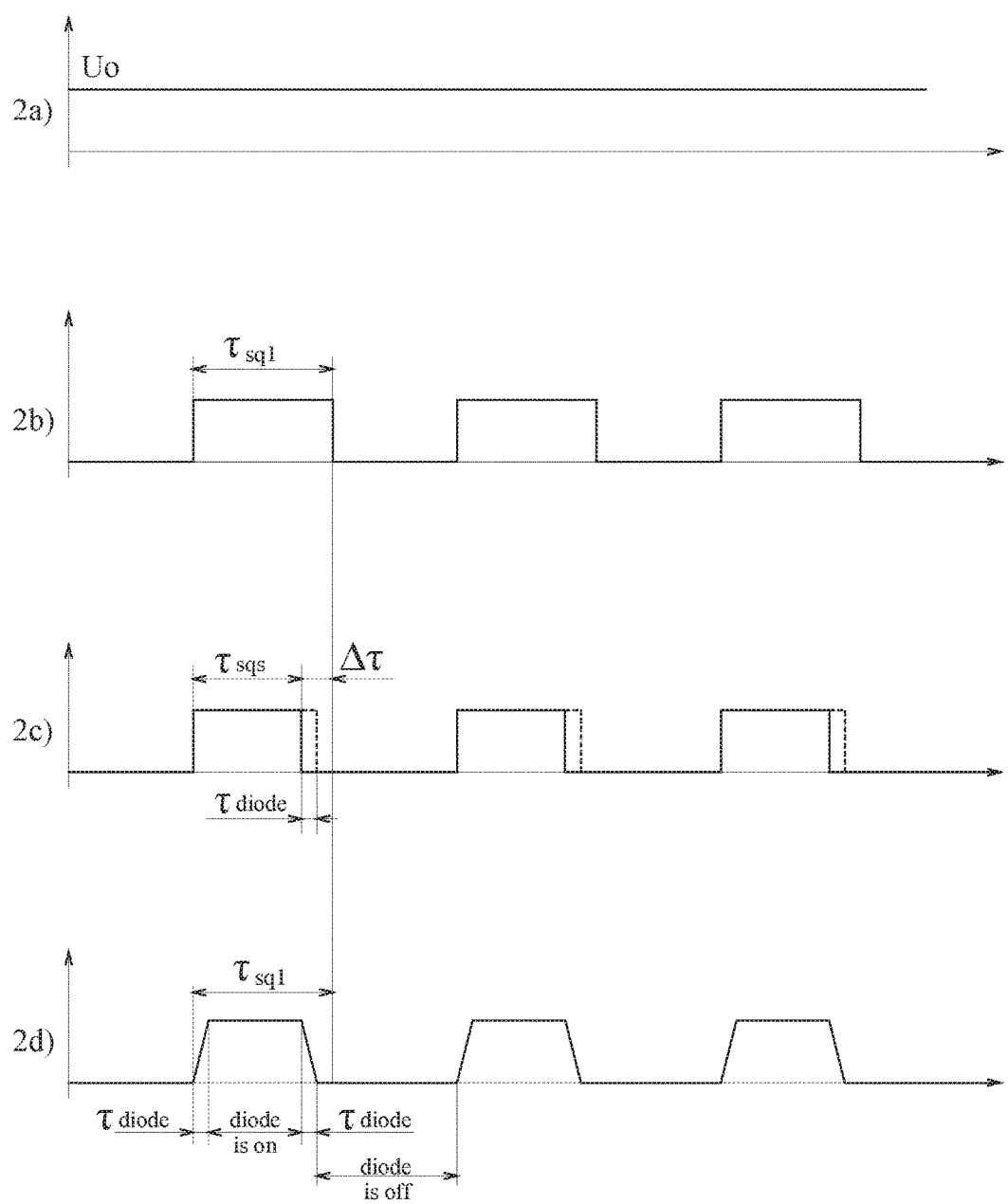
FIG. 2 is flow charts of voltages illustrating the operation of the apparatus.
Figure 2:
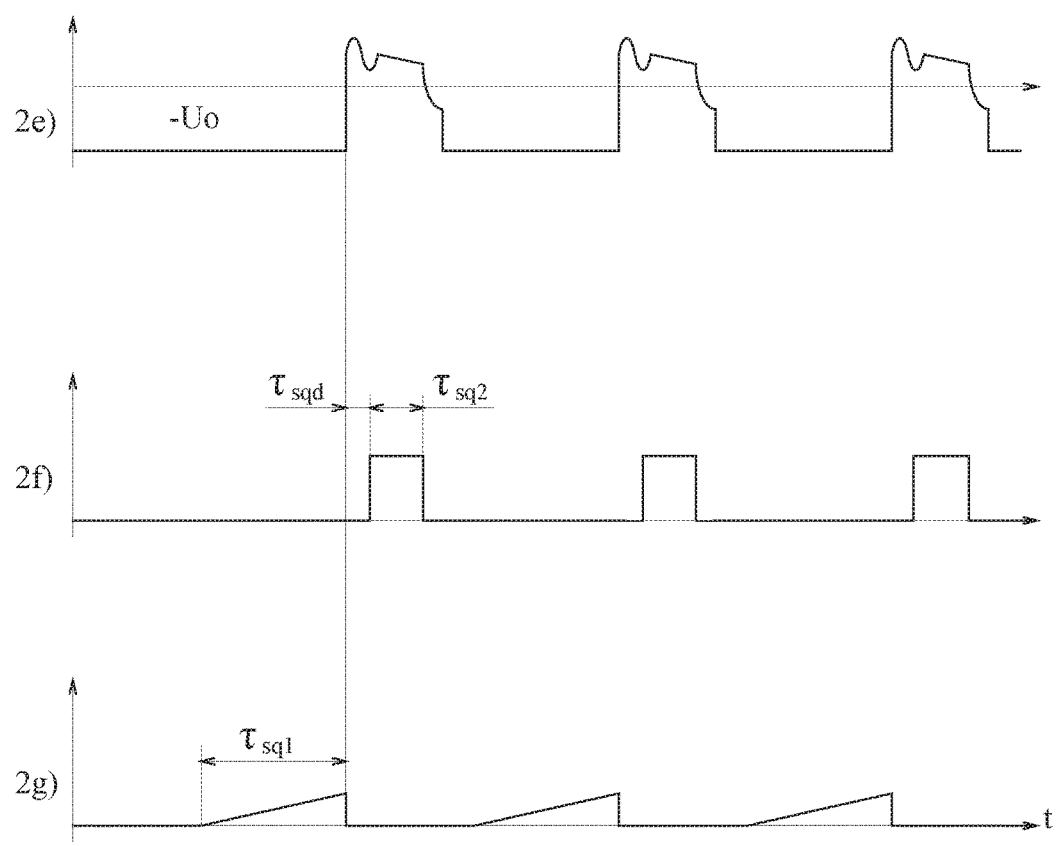

Flow charts of the voltages shown in FIG. 2 and acting in the apparatus illustrate:

a) DC voltage $U_0$ of the high DC voltage source 1;
b) control square pulses with a preset duration, $\tau_{sq1}$, at the first output 18 of the control circuit 14;
c) control square pulses with a preset duration, $\tau_{sqs}$, sawtooth pulse voltage at the output 35 of the converter 33 of square pulse duration, $\tau_{sqs}=\tau_{sq1}-\Delta\tau$, where $\Delta\tau>\tau_{diode}$ is a value of a protective time interval securing pre-connecting the anode of the diode 22 to the negative terminal of the low DC voltage source 12;
d) successive conditions of the diode 22: Diode is on, Diode is getting off during $\tau_{diode}$, and Diode is off;
e) high pulse voltage between terminals 8 and 4 at the inductive load 2;
f) control pulses, of the $\tau_{sq2}$ duration, at the second output 53 of the control circuit 14, these control pules being delayed relative the trailing edge of the square control pulses $\tau_{sq1}$ at the first output 18 of the control circuit 14 by the value of $\tau_{sqd}$;
g) saw-tooth pulse voltage at the low-ohmic resistor 11 of the first controlled gate 6 (which voltage reflects variations of current in the inductive load when the square control pulse with the preset duration $\tau_{sq1}$ acts).

The apparatus for providing high pulse voltage in the inductive load operates as follows.

Square pulses of the duration $\tau_{sq1}$, (see FIG. 2b) come from the output 18 of the control circuit 14 to the control input 19 of the first controlled gate 6 (to the gate of the MOS transistor) and thus open the first controlled gate 6. At that, the potential of the second terminal 8 of the inductive load 2 becomes close to zero relative to the potential of the negative terminal 10 of the high DC voltage source 1 and the negative terminal 13 of the low DC voltage source 12 connected to each other. Thus, the voltage difference between the terminals 8 and 4 of the inductive load 2 becomes close to the value of the output voltage of the high DC voltage source 1, and the inductive load 2 starts building up a high voltage square pulse (relative to the positive terminal 5 of the high DC voltage source 1) which is transformed into the secondary winding of the transformer 3. At the same time, square pulses from the first output 18 of the control circuit 14 come to the control input 34 of the first converter 33 of square pulse duration, which generates at the output 35 thereof a square pulse of the duration of $\tau_{sqs}=\tau_{sq1}-\Delta\tau$ (see the flow chart of FIG. 2c) which comes to the control input 36 of the second (additional) controlled switch 28.

By the action of the above-discussed control pulse, the second controlled switch 28 connects the first input 29 thereof (connected to the positive terminal 16 of the low DC voltage source 12) to the output 30 thereof (connected to the anode 31 of the diode 22). Consequently, current starts flowing from the positive terminal 16 of the low DC voltage source 12 through the second controlled switch 28, opened diode 22, first capacitor 20 and opened first controlled gate 6. This current is charging the first capacitor 20, thus creating voltage on the plates 21 and 24 thereof, the voltage being close by the value thereof to the output voltage of the low DC voltage source 12. After the controlling pulse of the duration $\tau_{sqs}=\tau_{sq1}-\Delta\tau$ ends at the control input 36 of the second controlled switch 28, the switch 28 connects the second input 32 thereof (connected with the negative terminal 13 of the low DC voltage source 12) to the output 30 thereof (connected with the anode of the diode 22).

Accordingly, the diode 22 turns off since applied to the cathode 23 thereof is the voltage between the plates of the first capacitor 20 charged earlier, the voltage being close to the output voltage of the low DC voltage source 12. Because of diode 22 response time, the turning off thereof takes time of $\tau_{diode}$ (see chart 2d in FIG. 2).

If the duration $\tau_{sqs}$ of the control pulse at the output 35 of the square pulse duration converter 33 is such that $\tau_{sq1}-\tau_{sqs}=\Delta\tau>\tau_{diode}$, then the diode 22 will be reliably off by the time of the ending of the control pulse of duration $\tau_{sq1}$ at the output 18 of the control circuit 14 (see charts 2c, d in FIG. 2).

After the square pulse of the duration $\tau_{sq1}$ coming to the control input 19 of the first controlled gate 6 (the gate of the MOS transistor) ends, the first controlled gate 6 turns off, and high voltage equal to the sum of the output voltage of the high DC voltage source 1 and voltage between terminals 8 and 4 of the inductive load 2 appears at the first terminal of the first controlled gate (the drain of the MOS transistor) connected to the terminal 8 of the inductive load 2.

At that moment, the voltage difference between terminals 8 and 4 of the inductive load 2 changes the sign thereof (see chart 2e in FIG. 2) indicating the end of generating high pulse voltage of the negative polarity in the inductive load.

Due to the fact that by this time the diode 22 has been reliably off (see chart 2d in FIG. 2), no pulse current surge happens through the incompletely closed diode 22 in the apparatus for generating high pulse voltage—unlike prior art apparatuses.

Seen on chart 2g in FIG. 2 can be the pulse voltage at the low-ohmic resistor 11 of the first controlled gate 5 which reflects a change of current in the inductive load 2 during the action of the control square pulse of the preset duration $\tau_{sq1}$. It shows that no short-time power pulse noise, caused in the prior art apparatuses by a surge of a pulse current through the incompletely closed diode 22, occurs at the end of generating high pulse voltage of the negative polarity in the inductive load 2, this resulting in better electromagnetic compatibility.

When the first controlled gate 6 turns off (after the control square pulse of the duration $\tau_{sq1}$ ends), voltage appears essentially instantaneously at the first terminal 7 (the drain of the MOS transistor) thereof from the positive terminal 5 of the high DC voltage source 1 via the inductive load 2. This voltage, equal to the sum of the output voltage of the high DC voltage source 1 and voltage between terminals 8 and 4 of the inductive load 2, is applied to the first plate 21 of the first capacitor 20, which was charged earlier to the voltage equal to the output voltage of the low DC voltage source 12. Consequently, the voltage difference between the first, 26, and second, 27, inputs of the first controlled switch 25 remains approximately equal to the output voltage of the low DC voltage source 12 but shifted (relative to the potential of the negative terminal 10 of the high DC voltage source 1 and the negative terminal 13 of the low DC voltage source 12 connected to each other) by the value equal to the sum of the output voltage of the high DC voltage source 1 and voltage between terminals 8 and 4 of the inductive load 2.

From the output 50 of the square pulse generator 47 of the control circuit 14, square pulses, having passed through the delay element 48 and the square pulse duration converter 49 of the control circuit 14 and having been converted as illustrated in chart 2f in FIG. 2, come to the control input 54 of the first controlled switch 25.

By the action of those pulses of the duration $\tau_{sq2}$, the first controlled switch 25 connects the first input 27 thereof with the output 46 thereof, thus connecting, respectively, the second plate 24 of the first capacitor 20 with the control input 45 of the second controlled gate 41.

As a result of that, the second controlled gate 41 goes open since a potential at the output 46 of the first controlled switch 25 turns out to be higher than the potential of the second terminal 44 (the source of the MOS transistor) of the second controlled gate 41 by the value of voltage between the plates 24 and 21 of the first capacitor 20 (which is close to the output voltage of the low DC voltage source 12). As long as the second controlled gate 41 is on, recharging the second capacitor 39 takes place in the circuit including the first terminal 4 of the inductive load 2, the second capacitor 39, the open second controlled gate 41, and the second terminal 8 of the inductive load 2.

After the control square pulse of the duration $\tau_{sq2}$ at the control input of the first controlled switch 25 ends, the controlled gates 6 and 41 go off (illustrated by charts 2b and 2f in FIG. 2), and dumped vibrations illustrated in chart 2e of FIG. 2 appear in a resonant circuit formed by transformer 3 primary winding leakage inductance and transformer 3 spurious capacitance (not shown). At the moment of minimal value of voltage at the first (main) terminal 7 of the first controlled gate 6 (drain of the MOS transistor), a control square pulse of the duration $\tau_{sq1}$ from the output 18 of the control circuit 14 is again applied to the control input 19 of the first controlled gate 25, and the all the processes repeat themselves.

In this way, the proposed apparatus for generating high pulse voltage in the inductive load allows providing apparatuses advantageously differing from the prior art in lesser level of noise radiated into the environment.

Functional units composing the above-discussed apparatus can be implemented in various ways. The square pulse duration converters 33 and 49 can, for example, be implemented as a monostable multivibrator described, for example, in "The 555 IC Project A Book" by Robert J. Traister, TAB Books, 1985. A power component of the controlled switches 7, 41 can include either a MOS transistor or an IGBT or a bipolar transistor or a thyristor, etc. All the other elements of the apparatus are well known in the art and disclosed in numerous publications on pulse technique and radioelectronics.

What is claimed is:

1. An apparatus for generating high pulse voltage, the apparatus comprising:
   a high DC voltage source;
   an inductive load made as a winding on a core and including a primary winding of a transformer, a secondary winding thereof being connected to a rectifier;
   a low DC voltage source;
   a control circuit;
   a first controlled gate;
   a diode;
   a first controlled switch;
   a first capacitor;
   a second controlled gate;
   a second capacitor;
   a second controlled switch; and
   a square pulse duration converter;
   a first terminal of the inductive load being connected to a positive terminal of the high DC voltage source;
   a negative terminal of the low DC voltage source being connected to a negative terminal of the high DC voltage source;
   power inputs of the control circuit being connected to respective terminals of the low DC voltage source;
   a first (main) terminal of the first controlled gate being connected to a second terminal of the inductive load, a second terminal of the first controlled gate being connected to the negative terminal of the high DC voltage source, and a control input of the first controlled gate being connected to a first output of the control circuit;
   a first input of the first controlled switch being connected to a cathode of the diode, a second input of the first controlled switch being connected to the second terminal of the inductive load, a control input of the first controlled switch being connected to a second output of the control circuit;
   a first plate of the first capacitor being connected to the first input of the first controlled switch, a second plate of the first capacitor being connected to the second input of the first controlled switch;
   a control input of the second controlled gate being connected to an output of the first controlled switch, a second terminal of the second controlled gate being connected to the second terminal of the inductive load;
   a first plate of the second capacitor being connected to the first terminal of the second controlled gate, a second plate of the second capacitor being connected to the positive terminal of the high DC voltage source;
   an input of the square pulse duration converter being connected to the first output of the control circuit, an output of the square pulse duration converter being connected to a control input of the second controlled switch;
   a first input of the second controlled switch being connected to the positive terminal of the low DC voltage source, a second input of the second controlled switch being connected to the negative terminal of the low DC voltage source, an output of the second controlled switch being connected to an anode of the diode.

* * * * *